(12) United States Patent
Zeller (10) Patent No.: US 11,275,138 B2
(45) Date of Patent: Mar. 15, 2022

(54) MAGNETIC RESONANCE DIXON METHOD (71) Applicant: Siemens Healthcare GmbH, Erlangen (DE)

(72) Inventor: Mario Zeller, Erlangen (DE)

(73) Assignee: Siemens Healthcare GmbH, Erlangen (DE)

( * ) Notice: Subject to any disclaimer, the term of this patent is extended or adjusted under 35 U.S.C. 154(b) by 0 days.

(21) Appl. No.: 17/024,021

(22) Filed: Sep. 17, 2020

(65) Prior Publication Data
US 2021/0080530 A1 Mar. 18, 2021

(30) Foreign Application Priority Data
Sep. 18, 2019 (EP) .................................... 19198062

(51) Int. Cl.
*G01R 33/48* (2006.01)
*G01R 33/56* (2006.01)
*G01R 33/561* (2006.01)
*G01R 33/565* (2006.01)

(52) U.S. Cl.
CPC ....... *G01R 33/4828* (2013.01); *G01R 33/482* (2013.01); *G01R 33/5608* (2013.01); *G01R 33/5611* (2013.01); *G01R 33/5617* (2013.01); *G01R 33/56509* (2013.01); *G01R 33/56545* (2013.01)

(58) Field of Classification Search
CPC .............. G01R 33/4828; G01R 33/482; G01R 33/5608; G01R 33/5611; G01R 33/5617; G01R 33/56509; G01R 33/56545; G01R 33/5676; G01R 33/5618; G01R 33/4818
See application file for complete search history.

(56) References Cited

U.S. PATENT DOCUMENTS

| 6,160,397 A | 12/2000 | Washburn et al. |
| 2010/0244822 A1* | 9/2010 | Yu .................... G01R 33/56554 324/307 |
| 2012/0146640 A1* | 6/2012 | Kusahara ......... G01R 33/56554 324/309 |
| 2018/0313927 A1 | 11/2018 | Zeller |
| 2019/0257906 A1 | 8/2019 | Zeller |

(Continued)

FOREIGN PATENT DOCUMENTS

DE 102017207128 A1 10/2018

OTHER PUBLICATIONS

Li, Zhiqiang et al. "Rapid water and lipid imaging with T2 mapping using a radial IDEAL-GRASE technique" Magnetic Resonance in Medicine, vol. 61, No. 6, pp. 1415-1424, 2009 // ISSN: 1522-2594, DOI: 10.1002/MRM.21918.

(Continued)

*Primary Examiner* — Susan S Lee
(74) *Attorney, Agent, or Firm* — Schiff Hardin LLP (57) ABSTRACT

Techniques are disclosed for acquiring at least two measurement datasets, each consisting of measurement data. The two measurement datasets are recorded at points in time at which spins of a first spin species present in the examination object have different phase positions from spins of a second spin species present in the examination object. Moreover, the two measurement datasets are recorded in each case while switching readout gradients of different polarity, and thus the desired measurement datasets may be recorded faster than conventional approaches.

17 Claims, 8 Drawing Sheets

(56) References Cited

U.S. PATENT DOCUMENTS

2020/0018809 A1* 1/2020 Duijndam ........ G01R 33/56518
2020/0333420 A1* 10/2020 Zeller ................ G01R 33/5608

OTHER PUBLICATIONS

Reeder, Scott B et al. "Multicoil Dixon Chemical Species Separation With anIterative Least-Squares Estimation Method" Magnetic Resonance In Medicine, vol. 51, No. 1, pp. 35-45, Jan. 2004 // https://doi.org/10.1002/mrm.10675.

Ma, Jingfei et al. "Fast Spin-Echo Triple-Echo Dixon (fTED) Technique for Efficient T2-Weighted Water and Fat Imaging" Magnetic Resonance in Medicine, vol. 58, No. 1, pp. 103-109, 2007 // DOI: 10.1002/mrm.21268.

Leinhard, O. D et al. "Water fat shift displacement artifact correction in two point Dixon imaging" Proc. Intl. Soc. Mag. Reson. Med. 16, 2008 // Abstract No. 1384.

Yu, Huanzhou et al. "Phase and Amplitude Correction for Multi-Echo Water-Fat Separation With Bipolar Acquisitions" Journal of Magnetic Resonance Imaging, vol. 31, pp. 1264-1271, 2010.

Imaios.com, "E-MRI—Image quality and artifacts", https://www.imaios.com/en/e-Courses/e-MRI/Image-quality-and-artifacts/chemical-shift, abgerufen: Aug. 17, 2020.

European Action dated Apr. 2, 2020, Application No. 19198062.2.

* cited by examiner

MAGNETIC RESONANCE DIXON METHOD

CROSS-REFERENCE TO RELATED APPLICATIONS

The present application claims the benefit of the filing date of European patent application no. EP19198062.2, filed on Sep. 18, 2019, the contents of which are incorporated herein by reference in their entirety.

TECHNICAL FIELD

The present disclosure relates to techniques for an improved magnetic resonance Dixon method.

BACKGROUND

Magnetic resonance (MR) technology is a known technology with which images can be created from the inside of an examination object. Expressed in simple terms, the examination object is positioned in a magnetic resonance device in a comparatively strong, static, homogeneous basic magnetic field, also called a B0 field, with field strengths from 0.2 Tesla to 7 Tesla and more so that its nuclear spins are oriented along the basic magnetic field. To trigger nuclear spin resonances, high-frequency excitation pulses (RF pulses) are radiated into the examination object, the nuclear spin resonances triggered are measured as what is known as k-space data, and MR images are reconstructed or spectroscopy data established on the basis of said data. For spatial encoding of the measurement data, rapidly switched magnetic gradient fields are superimposed on the basic magnetic field. The recorded measurement data is digitized and stored as complex numerical values in a k-space matrix. An associated MR image is reconstructed from the k-space matrix occupied by the values by means of a multi-dimensional Fourier transformation, for example.

Various MR techniques are known for separation of signals of different spin species, for example of spins in a water environment and spins in a fat environment or other environments, such as a silicon environment, in recorded MR data or to suppress the signals of specific spin species. These techniques include what are known as multi-contrast measurements. For the sake of simplicity, spins of a specific environment are referred to as spins of the spin species fat, water, silicon or possibly as spin species corresponding to another environment, without necessarily using the term "environment."

SUMMARY

Different spin species process differently, whereby a different magnetic field arises at the nucleus in each case, which leads to different resonant frequencies. This is referred to as a chemical shift between the different spin species. This leads during signal recording to different phase positions of the components corresponding to the various respective spin species. The most prominent representatives of two different spin species are fat and water, wherein other applications are also possible. The resonant frequencies of fat and water differ by around 3.3 ppm (parts per million). One method for separating the signals of two different types of tissue, such as fat and water for example, is to utilize the phase information of recorded MR signals.

One such technique is the Dixon technique, in which at least two MR datasets are recorded at different echo times in each case after an excitation, and are thus recorded with different contrasts. The echo times are selected in such a way that the relative phase position of different spin species of the signals contained in an MR dataset is different in the different recorded MR datasets. That is, in at least one of the recorded MR datasets, the phase position of one of the spin species contained in the MR dataset relative to another spin species contained in the MR dataset is other than in at least one other recorded MR dataset. With knowledge of the respective phase positions, combination images can be extracted from the MR image datasets reconstructed from the recorded MR datasets, which only represent signals, for instance, of one spin species. The combination images can thus also be referred to as parametric maps derived from the MR datasets acquired at the different echo times.

Basically a Dixon technique can be realized with different sequence types, for example with (turbo) spin echo sequences, SSFP sequences (SSFP: Steady-State Free Precession) or also gradient echo sequences, and is therefore versatile in its uses.

As different phase positions, which the spin species have relative to one another in e.g. two recorded MR datasets, frequently on the one hand a same phase position of the spin species, also called "in-phase," and on the other hand an opposing phase position, also called "opposed-phase" or "out-of-phase" are selected. However, other phase positions are also conceivable.

The underlying object of the disclosure is to make possible an improved recording of combination images of different spin species in such a way that a separation of the combination images into images of the individual spin species considered is as free from artifacts as possible.

The object is achieved by a method for recording of at least two measurement datasets of an examination object by means of magnetic resonance, a magnetic resonance apparatus, computer program, and electronically-readable data medium as claimed and otherwise described herein throughout the disclosure.

In an aspect, a method for recording at least two measurement datasets of an examination object by means of magnetic resonance comprises the steps:

Radiating (i.e. transmitting) at least one RF excitation pulse for excitation of spins into the examination object, Acquiring first measurement data of an echo signal created after a radiated RF excitation pulse at a first point in time at which spins of a first spin species present in the examination object have a first phase position relative to spins of a second spin species present in the examination object, while switching a readout gradient of a first polarity, Acquiring second measurement data of an echo signal created by the RF excitation pulse at a second point in time at which spins of the first spin species present in the examination object have a second phase position different to spins of the second spin species present in the examination object, while switching a readout gradient of a second polarity, wherein the first and the second polarity are different, Creating a first combination image (OP1) on the basis of the first measurement data acquired, Creating a second combination image (IP1) on the basis of the second measurement data acquired, Constructing at least one image, which only represents signals of a spin species from the group of the first and the second spin species, on the basis of the first and the second combination image.

The acquisition of at least two measurement datasets each of measurement data, which was recorded at points in time at which spins of a first spin species present in the examination object have a different phase position to spins of a second spin species present in the examination object, and which are each recorded by switching readout gradients of different polarity, makes it possible to record the desired measurement datasets especially quickly.

In an aspect, a magnetic resonance apparatus comprises a magnet unit, a gradient unit, a radio-frequency unit, and a control device with a measurement data processing unit embodied for carrying out an inventive method.

In an aspect, a computer program implements a method on a control device when it is executed on the control device.

The computer program can also be present here in the form of a computer program product (e.g. a non-transitory computer-readable medium), which is able to be loaded directly into a memory of a control device, with program code means for carrying out the method aspects when the computer program product is executed in the processing unit of the computer system.

In an aspect, an electronically-readable data medium comprises electronically-readable control information stored thereon, which comprises at least one computer program and which is embodied so that it carries out the methods described herein when the data medium is used in a control device of a magnetic resonance apparatus.

The advantages and details set out in relation to the method apply in a similar fashion to the magnetic resonance apparatus, the computer program, and the electronically-readable data medium

BRIEF DESCRIPTION OF THE DRAWINGS/FIGURES

Further advantages and details of the present invention emerge from the exemplary embodiments described below as well as with reference to the drawings. The examples given do not represent any restriction of the invention. In the figures.

DETAILED DESCRIPTION

Figure 9:
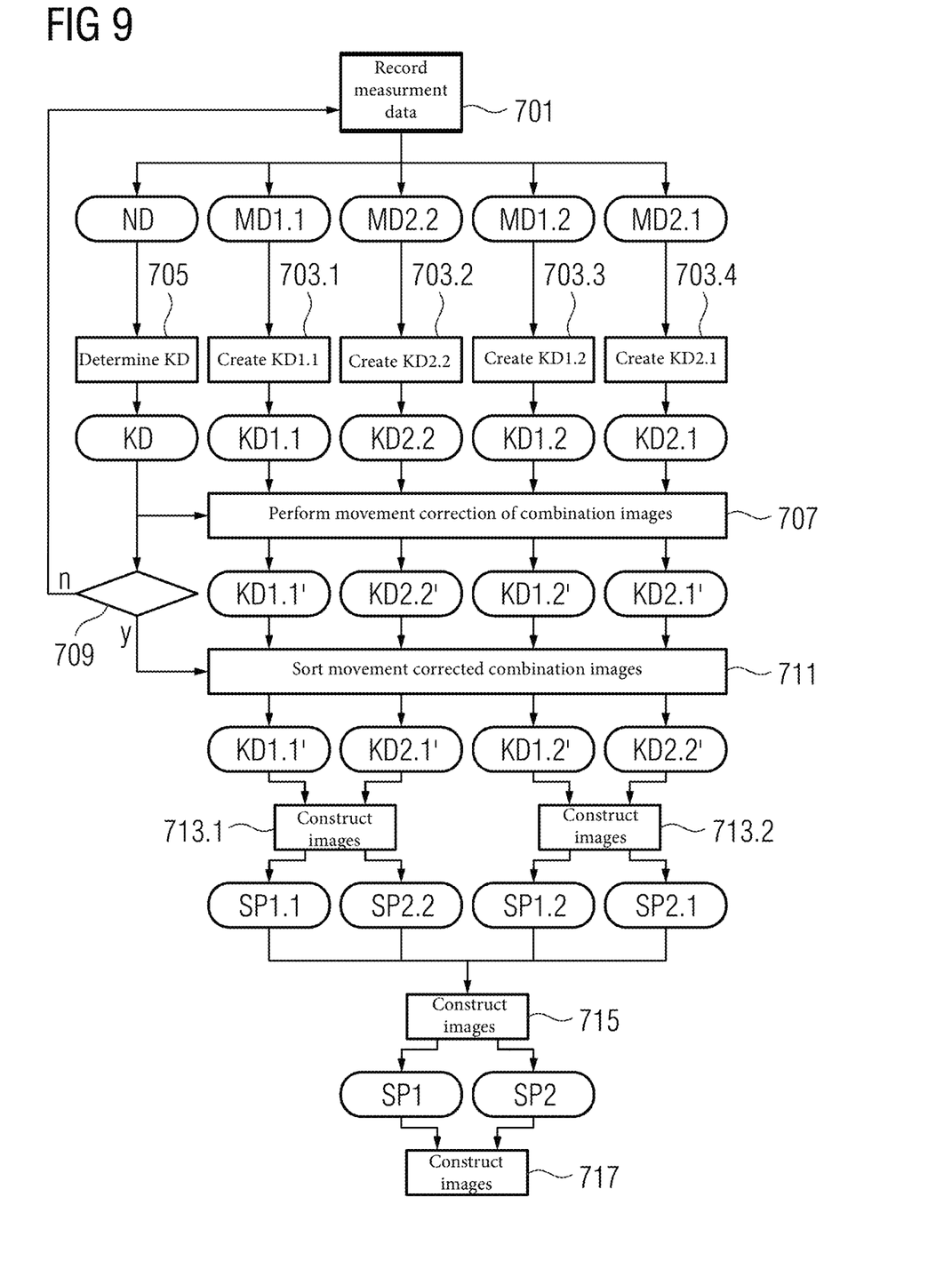
FIG. 9 shows a schematic flow diagram of example construction of images that contain signals of one spin species considered from recorded measurement data, in accordance with one or more aspects of the present disclosure.

FIG. 9 is a schematic flow diagram of a method for recording at least two measurement datasets of an examination object by means of magnetic resonance.

After at least one RF excitation pulse RF1 has been radiated in at least two measurement datasets, for example one measurement dataset that comprises first measurement data MD1.1 and/or MD1.2, and a second measurement dataset that comprises second measurement data MD2.1 and/or MD2.2, are recorded by acquiring the respective measurement data (block 701).

More precisely, first measurement data MD1.1 and/or MD1.2 is acquired at a first point in time at which spins of a first spin species present in the examination object have a first phase position relative to spins of a second spin species present in the examination object. A phase position of spins of the different spin species describes the position of the phase of the spins of the first spin species relative to the position of the phase of the spins of the second spin species. During the acquisition of the first measurement data MD1.1, a readout gradient is switched that has a first polarity. First measurement data acquired in this way can be included in a first measurement dataset, for example.

Furthermore, second measurement data MD2.1 and/or MD2.2 is acquired at a second point in time at which spins of the first spin species present in the examination object have a second phase position different from the first phase position relative to spins of the second spin species present in the examination object. During the acquisition of the second measurement data MD2.2, a readout gradient is switched that has a second polarity that is different from the first polarity. Second measurement data recorded in this way can be included in a second measurement dataset, for example.

It is possible to acquire for example measurement data of a measurement dataset of the acquired two measurement datasets at one point in time at which spins of the first spin species present in the examination object and spins of the second spin species present in the examination object have a same phase (i.e. phase position: in-phase).

In addition or as an alternative, measurement data of a measurement dataset of the recorded two measurement datasets can be acquired at a point in time at which spins of the first spin species present in the examination object have a phase that is in opposition to the phase which spins of the second spin species present in the examination object have (i.e. phase position: opposed-phase).

Further phase positions are conceivable and can be selected, inter alia, depending on the desired amount of time between the respective echo signals, wherein a requirement for the ability to distinguish between the selected phase positions usual in Dixon techniques should be imposed.

For the acquisition of the first and second measurement data different methods of operation are possible.

A specific Dixon technique, also known as fast Dixon, acquires the measurement data for the e.g. two different MR datasets after a common RF excitation or RF refocusing pulse (for example after each RF refocusing pulse of a Turbo Spin Echo (TSE) sequence), wherein a bipolar readout gradient is switched during the recording of the measurement data, i.e. the readout gradient has a first polarity while measurement data is being recorded for the first MR dataset and another polarity while measurement data is being recorded for the second MR dataset. This type of bipolar recording allows measurement data for the, e.g. two, different MR datasets to be acquired within a common echo train. In this way, it is no longer necessary to record the measurement data for the different MR datasets in separate measurements, as is the case for example in standard TSE Dixon methods, which use a separate measurement of the measurement data needed for each MR dataset, whereby the overall measurement time for fast Dixon is markedly reduced compared to such standard Dixon techniques.

Figure 1:
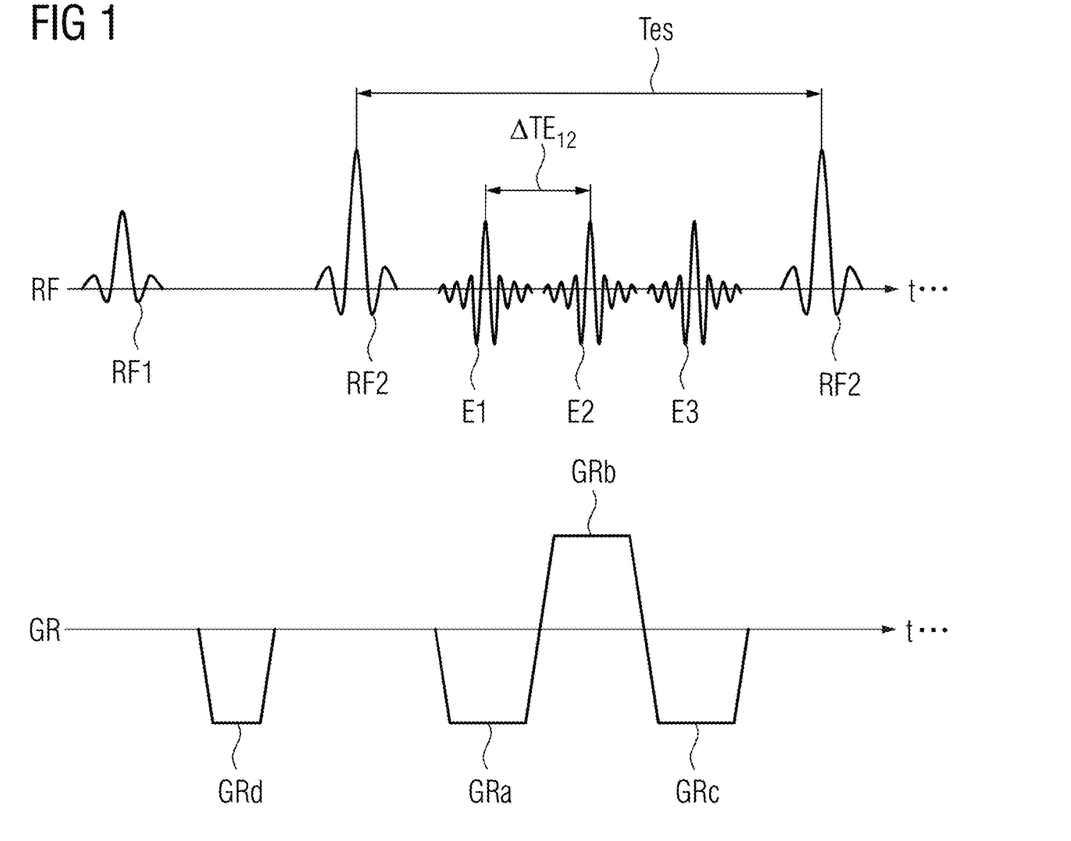
FIGS. 1-5 show examples of schematic sequence diagrams that may be implemented in accordance with one or more aspects of the present disclosure.

A schematic example of a section of a possible sequence diagram for such a method is shown in FIG. 1. Here, the upper line RF shows typical radio-frequency signals, which can be radiated signals RF1, RF2 or received signals E1, E2, E3, and the lower line shows typical gradients to be switched GRa, GRb, GRc, GRd, shown in the readout direction GR in their sequence over the time t.

After an RF excitation pulse RF1, a sequence of a number of refocusing pulses RF2 can be radiated in order, while switching gradients in the readout direction, to create at least two echo signals E1 and E2 and possibly E3 or more echo signals and read them out. An amount of time Tes between two consecutive RF refocusing pulses RF2 corresponds to an amount of time between similar echo signals E1, E2 or E3, created in each case after the consecutive RF refocusing pulses RF2. For the sake of clarity, possible gradients, which can be switched in the slice direction and/or phase encoding direction for a spatial encoding of the measurement data, are not shown.

The sequence diagram shown basically corresponds to a GRASE (Gradient And Spin Echo) sequence diagram, in which after an RF excitation pulse RF1, at least one RF refocusing pulse RF2 is radiated, and after an RF refocusing pulse RF2 likewise e.g. three echo signals E1, E2, E3 can be created and read out. The echo signal E1 is read out in the diagram by switching a readout gradient GRa with a first (negative in this example) polarity and the echo signal E2 following the echo signal E1 is read out by switching a readout gradient GRb with a second (positive in this example) polarity different from the first. Furthermore, a third echo signal E3 can be read out by switching a further readout gradient GRc, which typically again has the same polarity as the readout gradient GRa switched during the reading out of the first echo signal E1.

Thus here for example, after a radiated RF excitation pulse RF1, at least one RF refocusing pulse RF2 is radiated, and a first point in time at which a first echo signal E1 is created and read out and a second point in time at which a second echo signal E2 is created and read out, each follow on from a point in time at which an RF refocusing pulse RF2 has been radiated.

It is possible to read out a third echo signal E3 at a point in time at which the spin species considered again have the same phase position as at the point in time of the first echo signal E1, wherein for this the amount of time ΔTE23 (not shown) between the second echo signal E2 and the third echo signal E3 is selected accordingly. Such a method is described for example in the article by Ma et al., entitled "Fast Spin-Echo Triple-Echo Dixon (fTED) Technique for Efficient T2-Weighted Water and Fat Imaging," MRM 58, P. 103-109, 2007.

The readout gradient GRc shown in FIG. 1 can, however, also be used in addition to or as an alternative to the dephasing of the magnetization before the transmission of a subsequent refocusing pulse RF2. After the readout of the echo signals E1, E2 and possibly E3, a further RF refocusing pulse RF2 can be switched, after which, once again by switching readout gradients, further echo signals (no longer shown) can be created and read out.

By comparison with a conventional GRASE sequence, for a Dixon method, the respective phase positions of the spins of the different spin species present in the examination object are taken into account for the division of time as described above.

For example, first first measurement data MD1.1 can be acquired by reading out echo signals E1 described in FIG. 1 by switching a readout gradient GRa of a first polarity and first second measurement data MD2.2 by reading out echo signals E2 described in FIG. 1 by switching a readout gradient GRb of a second polarity.

Figure 2:
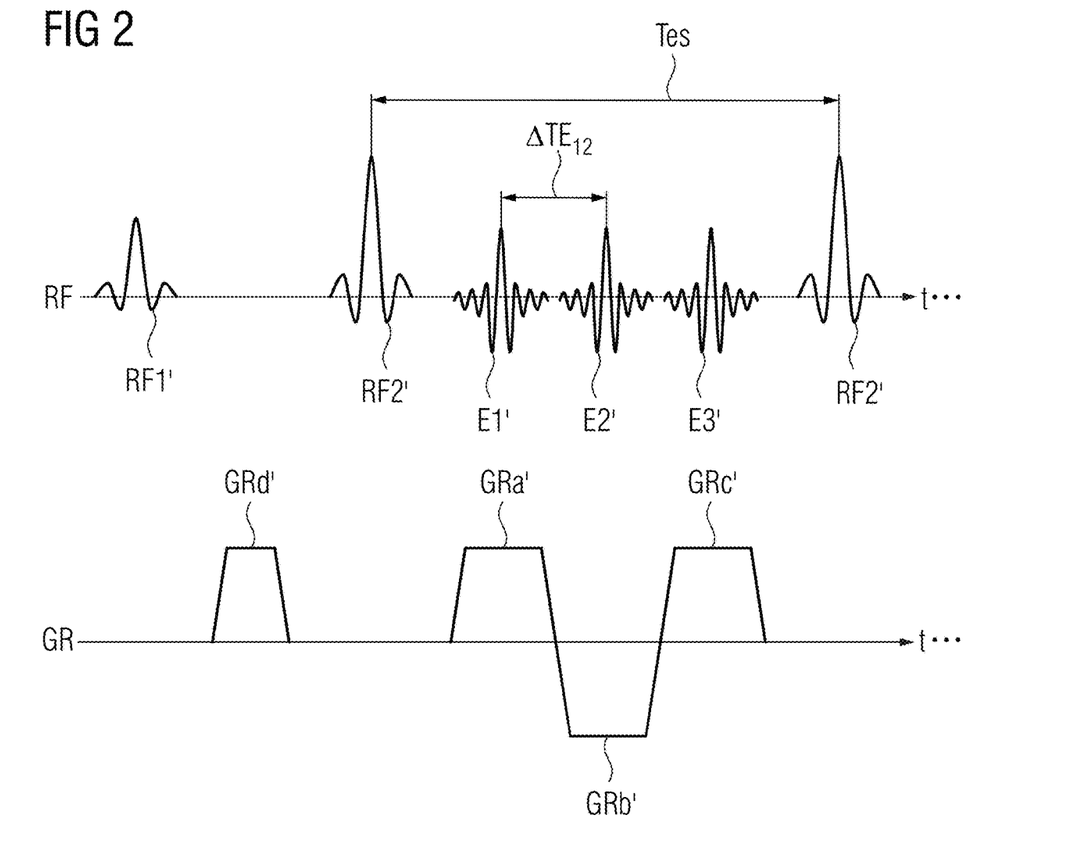

A further schematic example of a section of a possible sequence diagram for such a method is shown in FIG. 2. The example shown in FIG. 2 differs primarily from the example shown in FIG. 1 through the reversal of the polarities of the gradients GRa', GRb', GRc' and GRd' switched in the readout direction GR in FIG. 2, each in comparison to the gradients GRa, GRb, GRc and GRd switched in FIG. 1. After transmitting of an RF excitation pulse RF1' and of e.g. at least one RF refocusing pulse RF2', echo signals E1', E2' and E3' can thus be created and read out, wherein in FIG. 2 the polarity of the gradients GRa', GRb', GRc' and GRd' in readout direction GR, and thus the readout direction in the k-space, in which the echo signals E1', E2' and E3' shown are acquired, are opposed in each case to the polarity or readout direction in the k-space of the corresponding gradients GRa, GRb, GRc and GRd or of the corresponding echo signals E1, E2, E3 from FIG. 1. Apart from this, what was stated above in relation to FIG. 1 in relation to the echo signals E1, E2 and E3 and also to the gradients GRa, GRb, GRc, GRd FIG. 1 applies analogously for the echo signals E1', E2' and E3' and also for the gradients GRa', GRb', GRc' and GRd'.

For example, second first measurement data MD1.2 can be acquired by reading out echo signals E1' described in FIG. 2 by switching a readout gradient GRa' of the second polarity (by comparison with FIG. 1) and second second measurement data MD2.1 by reading out echo signals E2' described in FIG. 2 by switching a readout gradient GRb' of the first polarity (by comparison with FIG. 1). Thus, by switching a readout gradient GRa' of a second polarity, which differs from a first polarity and has a readout gradient GRa, under which first first measurement data MD1.1 were acquired, second first measurement data MD1.2 of an echo signal E1' created by an RF excitation pulse RF1' is acquired at a point in time at which spins of the first spin species present in the examination object have the first phase position relative to spins of the second spin species present in the examination object. Furthermore in this way, by switching a readout gradient GRb' of the first polarity, second second measurement data MD2.1 of an echo signal E2' created by the RF excitation pulse RF1' is acquired at a point in time at which spins of the first spin species present in the examination object have the second phase position relative to spins of the second spin species present in the examination object.

By using sequence diagrams in accordance with FIGS. 1 and 2, first first and first second measurement data MD1.1 and MD2.2 can be acquired after a common RF excitation pulse RF1, and second first and second second measurement data MD1.2 and MD2.1 can be acquired after another common RF excitation pulse RF1'.

In particular, in order to keep a movement of the examination object as small as possible between the recordings of the first first and first second measurement data MD1.1 and MD2.2 on the one hand, and second first and second second measurement data MD1.2 and MD2.1 on the other hand, an acquisition of first first and first second measurement data MD1.1 and MD2.2 on the one hand and an acquisition of its corresponding second first and second second measurement data MD1.2 and MD2.1 in relation to its k-space position on the other hand can take place with an amount of time between them that is as small as possible, i.e. the recordings of the first first and first second measurement data MD1.1 and MD2.2 on the one hand and second first and second second measurement data MD1.2 and MD2.1 on the other hand can be carried out one after another with the smallest possible amount of time, e.g. spaced by only one repetition time TR, after one another.

Figure 3:
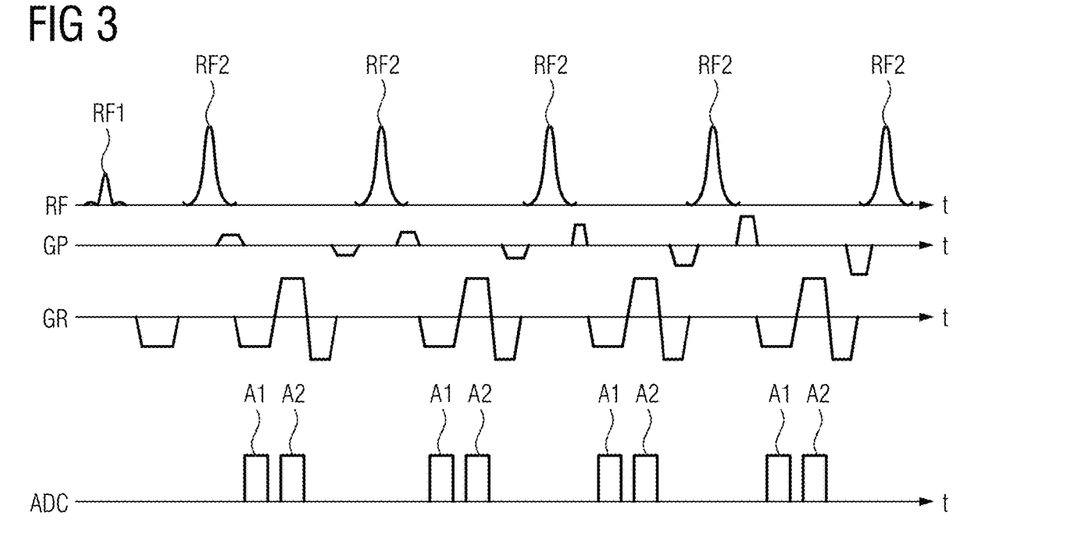

FIG. 3 shows a further schematic example of a section of a possible sequence diagram in accordance with the aspects described herein, which is related to the example shown in FIG. 1 but is embodied somewhat differently however, to illustrate other variants. Unlike in FIGS. 1 and 2, in FIG. 3 it is not the created echo signals that are shown, but the line ADC shows the readout windows A1 and A2, which reflect the time windows in which a respective acquisition of first measurement data, e.g. in readout windows A1, and second measurement data, e.g. in readout windows A2, takes place. For the amount of time that is to be adhered to in each case after a common RF refocusing pulse of consecutive readout windows A1 and A2, in this case the same applies for the amount of time ΔTE12 between the two recorded echo signals E1 and E2 or E1' and E2' in FIGS. 1 and 2. Moreover, shown by way of example in FIG. 3 are five (considerably more are conceivable) RF refocusing pulses RF2, which follow an RF excitation pulse RF1 common to them, and represent the gradient switching in the phase encoding direction GP, to illustrate how the gradients in the phase encoding direction GP can be changed in each case for consecutive RF refocusing pulses RF2, in order after each RF refocusing pulse RF2 to be able to acquire differently encoded measurement data, e.g. another k-space row in each case, in the respective, readout windows A1 and A2 assigned to different RF refocusing pulses RF2. For example, after a first RF refocusing pulse RF2, a first k-space row in which output windows A1 and A2 assigned to the first RF refocusing pulse are read out, and after a second RF refocusing pulse RF2, different from the first RF refocusing pulse RF2, another k-space row different from the first k-space row, in which the readout windows A1 and A2 assigned to the second RF refocusing pulse RF2 can be read out.

In this case, the gradients in the phase encoding direction GP in the example shown here, which are switched immediately before an RF refocusing pulse RF2, and/or the gradients in the readout direction GR in the example shown here, which follow on directly from a readout window A2, are used for the dephasing of the still excited spins in each case. The more RF refocusing pulses RF2 that are radiated after a common RF excitation pulse RF1, the more quickly the desired measurement data can be acquired.

For example, first first measurement data MD1.1 can be acquired in the readout windows A1 described in FIG. 3 and first second measurement data MD2.2 in the readout windows A2 described in FIG. 3. If the gradients shown in FIG. 3 are reversed, with regards to their polarity in the readout direction GR (like the readout gradients GRa', GRb', GRc', GRd' from FIG. 2 are reversed compared to the readout gradients GRa, GRb, GRc, GRd from FIG. 1), with this type of switching of the pulse sequence (not shown) second first measurement data MD1.2 can be acquired for example in the corresponding readout windows A1 and second second measurement data MD2.1 in the corresponding readout windows A2. For first first, first second, second first, and second second measurement data MD1.1, MD2.1, MD1.2, and MD2.2 acquired respectively in this way, what has already been stated above with regard to FIGS. 1 and 2 essentially applies.

Figure 4:
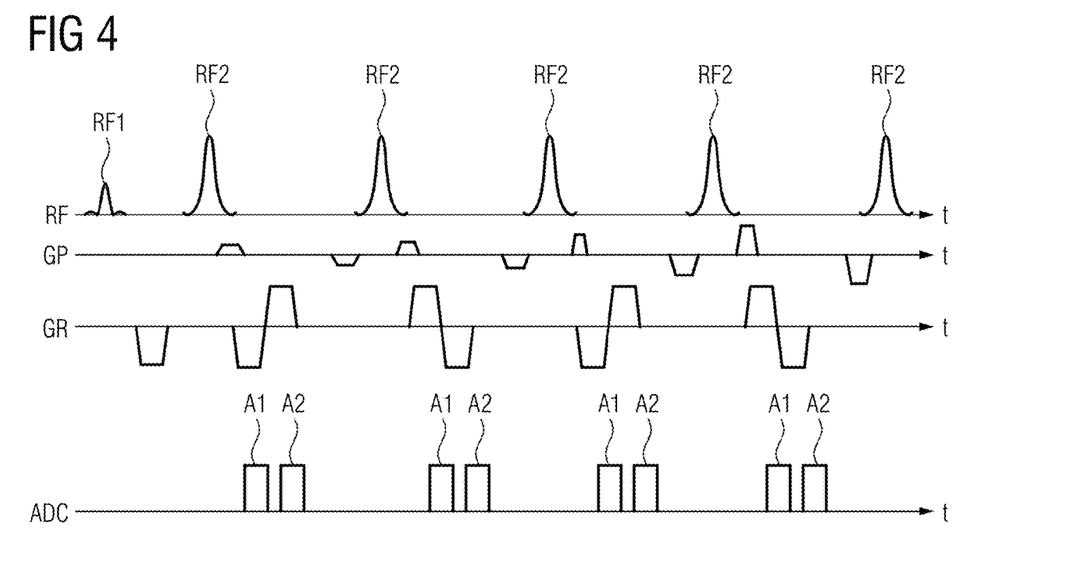

FIG. 4 shows a further schematic example of a section of a possible sequence diagram in accordance with the aspects as described herein, which differs from the example shown in FIG. 3 primarily in the switching of the gradients in readout direction GR. What has been stated above with regard to FIG. 3 as regards an amount of time to be adhered to in each case after a common RF refocusing pulse of consecutive readout windows A1 and A2, which corresponds to an amount of time ΔTE12 of the two recorded echo signals E1 and E2 or E1' and E2' in FIGS. 1 and 2, applies analogously for the example shown in FIG. 4.

In the example shown in FIG. 4, first and second measurement data MD1.1 and MD2.2 or MD1.2 and MD2.1, is likewise recorded after a common RF refocusing pulse RF2 in each case in readout windows A1 and A2, however after a radiated-in RF excitation pulse RF1 a sequence of RF refocusing pulses RF2 is radiated, and after consecutive RF refocusing pulses RF2 of the sequence, first first and first second measurement data MD1.1 and MD2.2 on the one hand (e.g. after a first RF refocusing pulse RF2) and second first and second second measurement data MD1.2 and MD2.1 on the other hand (after an RF refocusing pulse RF2 following the first RF refocusing pulse RF2) is now acquired alternately. This can occur by the gradients in the readout direction GR switched during the readout window A1 on the one hand and A2 on the other hand being reversed after consecutive RF refocusing pulses RF2 as shown. The polarity of the gradients in readout direction GR switched during the readout windows A1 or A2 thus alternates for readout window A1 or A2 assigned to consecutive RF refocusing pulses RF2. A sequence diagram with gradients in readout direction Gr reversed after each RF refocusing pulse RF2, as is shown in FIG. 4 for example, as well as the possibility of recording all measurement data required for imaging in only one measurement process, has the further advantage that just because of the alternating switching of the gradients in readout direction GR additional dephasing/turnback gradients can be dispensed with. Therefore, no time windows for such dephasing/turnback gradients are needed and the pulse sequence diagram can be designed correspondingly narrow and thus the required measurement data acquired more quickly, in particular (taking into account the selected first and second phase position) the amount of time ΔTE12 or ΔTE12 between two echo signals created and to be read out can be shortened.

Thus, in a way described above, first first measurement data MD1.1, first second measurement data MD2.2, second first measurement data MD1.2, and second second measurement data MD2.1 can be acquired after a common RF excitation pulse RF1, for example.

On the basis of acquired first measurement data MD1.1 or MD1.2, a first combination image KD1.1 or KD1.2 can be created, and on the basis of second measurement data MD2.1 or MD2.2 acquired a second combination image KD2.1 or KD2.2 can be created (blocks 703.1, 703.2, 703.3, 703.4), wherein a combination image in each case comprises signals of all excited spin species, i.e. in particular those of the first and the second spin species located in the examination object.

In the acquisition of the first measurement data MD1.1 and/or MD1.2 and in the acquisition of the second measurement data MD2.2 and/or MD2.1, it is possible to record the measurement data in such a way that all acquired first first measurement data MD1.1 produces an undersampled set of first first measurement data MD1.1 in accordance with Nyquist and/or all acquired first second measurement data MD2.2 produces an undersampled set of first second measurement data MD2.2 in accordance with Nyquist and/or all acquired second first measurement data MD1.2 produces an undersampled set of second first measurement data MD1.2 in accordance with Nyquist and/or all acquired second second measurement data MD2.1 produces an undersampled set of second second measurement data MD2.1 in accordance with Nyquist.

If measurement data MD1.1, MD2.1, MD1.2, and/or MD2.2 has been acquired undersampled in accordance with Nyquist, the respective creation of a corresponding combination image KD1.1, KD2.1, KD1.2, and/or KD2.2 in the corresponding blocks 703.1, 703.2, 703.3, 703.4 can comprise a filling up of measurement data not acquired but requested according to Nyquist. Such filling up can be done by means of a parallel imaging technique (e.g. ppa, partial parallel acquisition), such as for example SMASH (simultaneous acquisition of spatial harmonics), GRAPPA (generalized autocalibrating partially parallel acquisition) or SENSE (sensitivity encoding). Measurement data can be acquired in such a case with the aid of a number of receive coils and undersampled sets of first first, first second, second first, or second second acquired measurement data MD1.1, MD2.2, MD1.2, MD2.1 can be expanded to complete sets of measurement data using a parallel imaging technique.

Figure 6:
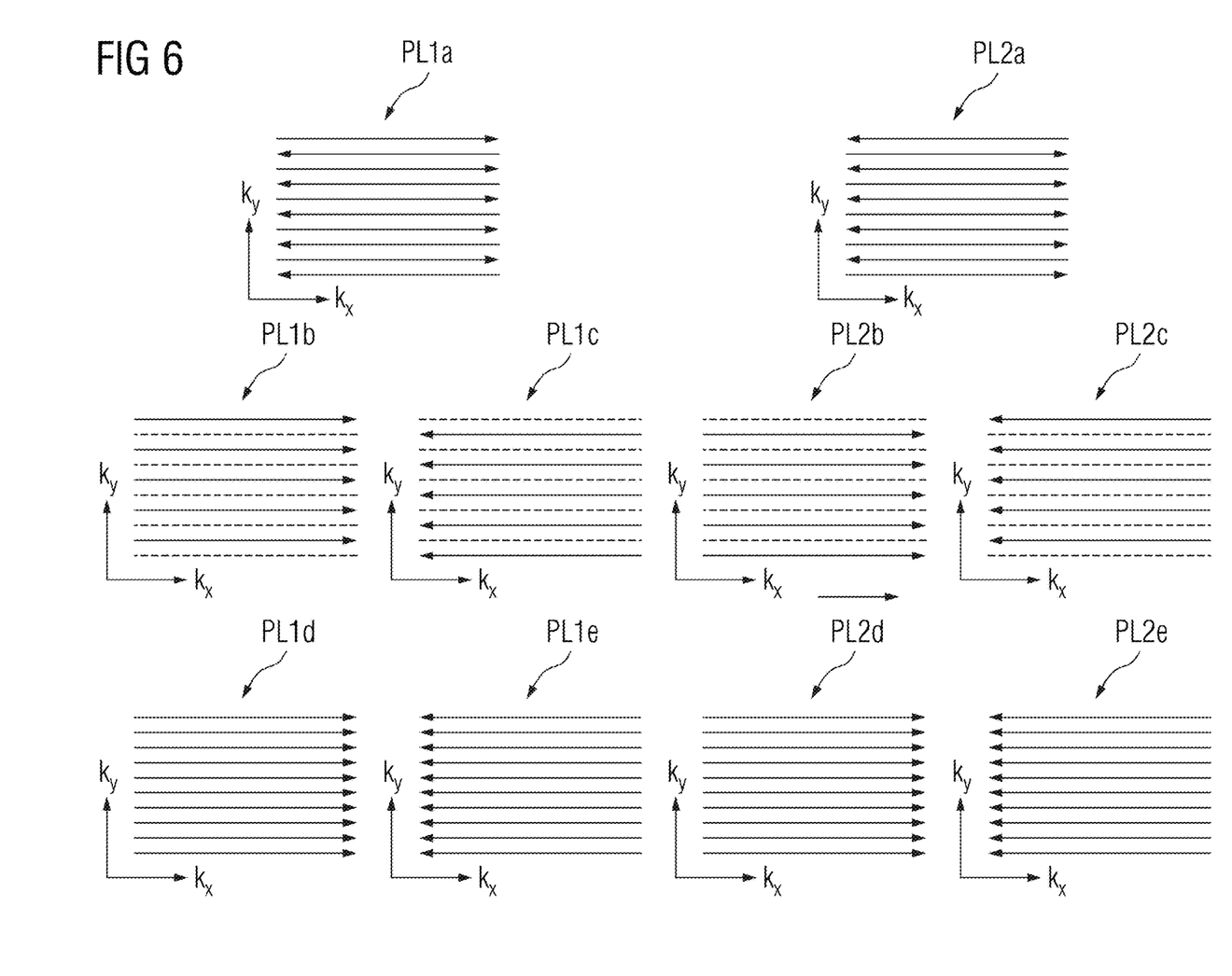
FIGS. 6-8 show diagrams of example k-space trajectories for measurement data recorded at different points in time, which may be acquired in accordance with one or more aspects of the present disclosure.

An undersampled recording of measurement data in accordance with Nyquist can be done for example as is shown in the middle row in FIG. 6, in which the k-space in the plane spanned by the readout direction kx and phase encoding direction ky for different examples of possible methods of operation for the recording of measurement data at different points in time is shown in each case. An encoding in the kz direction, e.g. by gradients in the slice selection direction, can be carried out in addition to excite spins of a specific slice or of a specific restricted volume.

In FIG. 6, the k-space trajectories, here as k-space rows for example, along which measurement data is acquired, or along which measurement data has been expanded if necessary by means of a ppa technique for example, are shown in each case as solid line arrows, wherein the direction of the arrow shows the readout direction. K-space trajectories of non-acquired measurement data are shown as dashed lines.

Shown in the central rows of FIG. 6 are four k-spaces PL1b, PL1c, PL2b and PL2c, which are each filled with measurement data only in each second k-space row to be filled according to Nyquist. Here, the k-space rows of the k-spaces PL1b and PL1c are filled with first measurement data, which was acquired at a point in time at which spins of a first spin species present in the examination object have a first phase position in relation to spins of a second spin species present in the examination object, and the k-space rows of the k-spaces PL2b and PL2c are filled with second measurement data, which was acquired at a point in time at which spins of the first spin species present in the examination object have a second phase position in relation to spins of the second spin species present in the examination object.

Thus here, in an undersampled set of first first PL1b, first second PL2c, second first PL1c, or second second PL2b acquired measurement data, measurement data of each second k-space row is missing in each case.

In the examples shown in the middle rows in FIG. 6, different k-space rows in each case are filled with acquired measurement data in different readout directions in the k-spaces PL1 and PL1c and also in the k-spaces PL2b and PL2c. Such a recording of measurement data can be done for example with the aid of a sequence diagram in accordance with one of FIG. 1, 2 or 3, by the gradients in the phase encoding direction GP each being switched in such a way that not all measurement data required in accordance with Nyquist is acquired (whereby the acquired measurement data would fill k-spaces PL1d, PL1e, PL2d and PL2e as shown in FIG. 6 at the bottom), but for example every second k-space row. It is also possible however to use a sequence diagram in accordance with FIG. 4, which for example reads out the first measurement data as shown at the top left in FIG. 6 in a k-space PL1a row-by-row in an alternating readout direction, and reads out the second measurement data as shown at the top right in FIG. 6 in a k-space PL2a row-by-row in an alternating readout direction. Measurement data recorded in this way can be acquired in an especially short measurement time, also in just one measurement process (as a so-called single-shot recording) at least at a speed corresponding to a fast Dixon method (or faster) and subsequently separated in its readout direction (and thus in accordance with the polarity of the gradients used in the readout direction during the acquisition of the measurement data) in k-spaces PL1b and PL1c or PL2b and PL2c, before missing measurement data is expanded in the respective k-spaces, e.g. by means of a ppa technique. If the gradients in the phase encoding direction are switched accordingly, measurement data for a complete filling of the k-space in each case can also be acquired with a sequence diagram in accordance with FIG. 4, for which if necessary a repetition of a recording can also be carried out after a transmission of a new RF excitation pulse RF1.

In any event, it is also conceivable for the measurement data to be recorded in such a way that it fills the same k-space rows in the k-spaces PL1b and PL1c and also PL2b and PL2c in the different readout directions. For this, the gradients may be adapted accordingly in the phase encoding direction.

After a respective expansion of missing measurement data in undersampled k-spaces PL1b, PL1c, PL2b, PL2c or through a complete sampling and thereby acquisition of a complete set of corresponding measurement data, as shown in FIG. 6 at the bottom, separate k-spaces PL1d, PL1e, PL2d, and PL2e for the first and the second phase position and both readout directions completely filled with acquired and/or expanded measurement data can be obtained in each case (i.e. for the different polarities of the gradients in the readout direction, which were switched during the acquisition of the measurement data), which each comprise first first measurement data MD1.1, second first measurement data MD1.2, second second measurement data MD2.1, and first second measurement data MD2.2, from which in each case, e.g. by Fourier transformation, a combination image KD1.1, KD1.2, KD2.1, and KD2.2 can be created.

The advantage of a recording of first first and second first measurement data MD1.1 and MD 1.2, and first second and second second measurement data MD2.2 and MD2.1 will be explained below.

The amount of time $\Delta TE12$ between the two recorded echo signals E1 and E2 or E1' and E2' or between the readout windows A1 and A2 depends, as stated, on the desired different relative phase position of the spin species considered. $\Delta TE12$ for two fixed, desired phase positions decreases linearly as the strength of the basic magnetic field increases. At approximately 3T $\Delta TE12$ for the two phase positions "in-phase" and "opposed-phase" amounts to approximately 1.2 milliseconds.

Because of the shortness of the amount of time $\Delta TE12$ between the echo signals E1 and E2 or E1' and E2', and the thus likewise relatively short time that is available for the recording of the measurement data, the readout bandwidth is typically increased. This leads to the SNR (Signal-to-Noise Ratio) being reduced however, which is why the same measurement data is often recorded multiple times, to be able to process said data with each other with an averaging method, and thus to improve the SNR again. However, this negates the advantage of the shorter overall measurement time outlined above again.

Such averages are also employed in conventional Dixon methods to improve the SNR. An enlarged readout bandwidth as described above can however, through the SNR reduced thereby, increase the number of recordings of the same measurement data required for an averaging of comparable quality compared to the conventional Dixon methods.

Through the recording of the measurement data of the different MR datasets with readout gradients of different polarity, chemical shift artifacts occur, referring to shifts of the measurement data, which occur at boundary surfaces between regions in which different spin species dominate in each case, and from which different resonant frequencies of the different spin species result in different directions depending on the polarity of the respective readout gradient. Thus, such differently recorded MR datasets, in particular with fast Dixon methods, which read out the measurement data of the different MR datasets with readout gradients of different polarity (bipolar Dixon method), are affected differently by chemical shift artifacts. In conventional Dixon methods in which the measurement data is always recorded with readout gradients of the same polarity, the measurement data of the different MR datasets is shifted in the same way and can be easily registered with one another. The different directions of the chemical shift artifacts in the differently recorded MR datasets with bipolar Dixon methods can lead to considerable edge and/or blurring artifacts at the boundary surfaces, at which regions dominated by different spin species considered adjoin each other.

This can be explained for example by the idealized signal equations for an in-phase dataset and an opposed-phase dataset, as are also described for example in the article by Leinhard et al. "Water fat shift displacement artifact correction in two point Dixon imaging," Proc. Intl. Soc. Mag. Reson. Med. 16 (2008), P. 1384.

A signal $M1(\delta)$ at location $\delta$ (e.g. at pixel $\delta$) of a dataset of a first phase position, explained below using the example of an in-phase dataset, contains the signal of the first spin species, e.g. water, at location $\delta$, $W(\delta)$, plus the signal of the second spin species, e.g. fat, at location $\delta$, to which however a shift value chs corresponding to the chemical shift present between the spin species considered must be applied, $F(\delta+chs)$, which produces:

$$M1(\delta)=W(\delta)+F(\delta+chs). \quad (1)$$

For a conventional Dixon method in which each MR dataset has been recorded with readout gradients of the same polarity, for a signal $M2$ of a dataset of a second phase position, explained below using the example of an opposed-phase dataset, in a similar way:

$$M2(\delta)=W(\delta)-F(\delta+chs), \quad (2)$$

wherein the signals of the first and the second spin species must now be subtracted from one another, since they were in an opposed phase position when they were recorded.

For a Dixon method with different polarity of the readout gradients for different MR datasets, simply on account of the different polarity of the readout gradients used, the shift value chs dependent on the chemical shift must have a different leading sign applied to it in the different MR datasets. The result is the signal equations of in-phase datasets $IP(\delta)$ and opposed-phase datasets $OP(\delta)$, which were recorded with readout gradients of different polarity, i.e. for a fast Dixon method, for example, similar to the above equations (1) and (2) of:

$$M1(\delta)=W(\delta)+F(\delta+chs), \quad (3)$$

$$M2(\delta)=W(\delta)-F(\delta-chs). \quad (4)$$

In conventional Dixon methods, as can be seen from the equations (1) and (2), the signals of the individual pixels of MR images of the pure spin species can be created by addition or subtraction of the recorded MR datasets M1 and M2:

$$0.5*(M1(\delta)+M2(\delta))=W(\delta), \quad (5)$$

$$0.5*(M1(\delta)-M2(\delta))=F(\delta+chs), \quad (6)$$

wherein e.g. $W(\delta)$ can refer to the signal of a water image at location $\delta$ and $F(\delta+chs)$ to the signal of a fat image at location $\delta+chs$, if water and fat have been selected as different spin species.

As can be seen, the shift of the signal caused by the chemical shift only occurs in the selected example in the image of the second spin species $F(\delta+chs)$. Therefore, the two created images F and W of the individual spin species can be made to coincide by a simple registration. In a similar way, the shift can also be considered in relation to the first spin species; in the case of water and fat as different spin species, however, it has become the norm to determine the shift relative to the water signal and therefore to add it on to the fat signal.

In the case of a recording of the different MR datasets each with another polarity, the equations (3) and (4) are to be used, whereby the following result is produced for an addition or a subtraction of the different MR datasets:

$$0.5*(M1(\delta)+M2(\delta))=0.5*(2W(\delta)+F(\delta+chs)-F(\delta-chs)), \quad (7)$$

$$0.5*(M1(\delta)-M2(\delta))=0.5*(F(\delta+chs)+F(\delta-chs)). \quad (8)$$

Thus, pure signals of just one spin species are no longer obtained, since disturbance terms dependent on the chemical shift remain. As described in the article by Leinhard et al. already mentioned, these lead to edges in the MR images of the first spin species obtained, in particular water, and to blurring in the MR images of the second spin species obtained, in particular fat. In the cited article by Leinhard et al. an iterative correction is proposed in order to compensate for the disturbance terms, which needs experimentally determined regularization factors.

By a recording of first first and second first measurement data MD1.1 and MD 1.2 and of first second and second second measurement data MD2.2 and MD2.1 as explained in particular in relation to FIGS. 1 to 4, for each polarity of an associated gradient in readout direction GR one first image of the first phase position M1.1, can now be created from the recorded set of first measurement data MD1.1 (for the first polarity) and one second image of the first phase position M1.2 from the recorded set of first measurement data MD1.2 (for the second polarity), and also one first image of the second phase position M2.1 from the recorded set of second measurement data MD2.1 (for the first polarity) and a second image of the second phase position M2.2 from the recorded set of second measurement data MD2.2 (for the second polarity) in each case.

From these, in a similar manner to equations (5) and (6), the signal components of the individual spin species, again using water W and fat F as an example, can be established at location $\delta$ as follows, each in two ways:

$$0.5*(M1.1(\delta)+M2.1(\delta))=W(\delta) \quad (9)$$

$$0.5*(M1.2(\delta)+M2.2(\delta))=W(\delta) \quad (10)$$

$$0.5*(M1.1(\delta)-M2.1(\delta))=F(\delta+chs) \quad (11)$$

$$0.5*(M1.2(\delta)-M2.2(\delta))=F(\delta-chs) \quad (12)$$

Thus, two sets of images of the different spin species W and F are obtained in each case, wherein the images obtained by addition of the first spin species (see equations (9) and (10)) are free from shift artifacts, and the images obtained by subtraction of the second spin species (see equations (11 and (12)) each have a global shift in different directions (±ch), which can easily be compensated for however by a normal registration method or by a normal correction method for example, which can correct the shift on the basis of the recording parameters used (in particular the bandwidth and the field strength of the RF pulse and magnetic fields used).

Thus, disturbance terms in the images obtained of the individual spin species considered can be corrected in this way completely and directly based on the acquired measurement data and with little computing effort, and without experimental factors having to be determined. Moreover, by the direct correction of shift artifacts based on acquired measurement data, the image quality of the images obtained of individual spin species considered is enhanced compared to images that were created using iterative correction methods.

The method described herein of an acquisition of measurement data for different phase positions for different polarities of the gradients used during the acquisition in each case in the readout direction can be used in particular for TSE (Turbo Spin Echo) DIXON methods, but also for other suitable methods such as VIBE (Volumetric Interpolated Breath-hold Examination) DIXON methods, for other bipolar Dixon recording methods, or for bipolar field-mapping methods, for example decay rate (T1/T2/T2*) mapping or field strength (B0/B1) mapping methods, etc.

As already mentioned above in particular in relation to FIGS. 1 and 3, at a third point in time following an RF excitation pulse RF1 or an RF refocusing pulse RF2, third echo signals E3, E3' can be created and read out as further measurement data. This further measurement data can be stored for example as navigator data ND.

Figure 5:
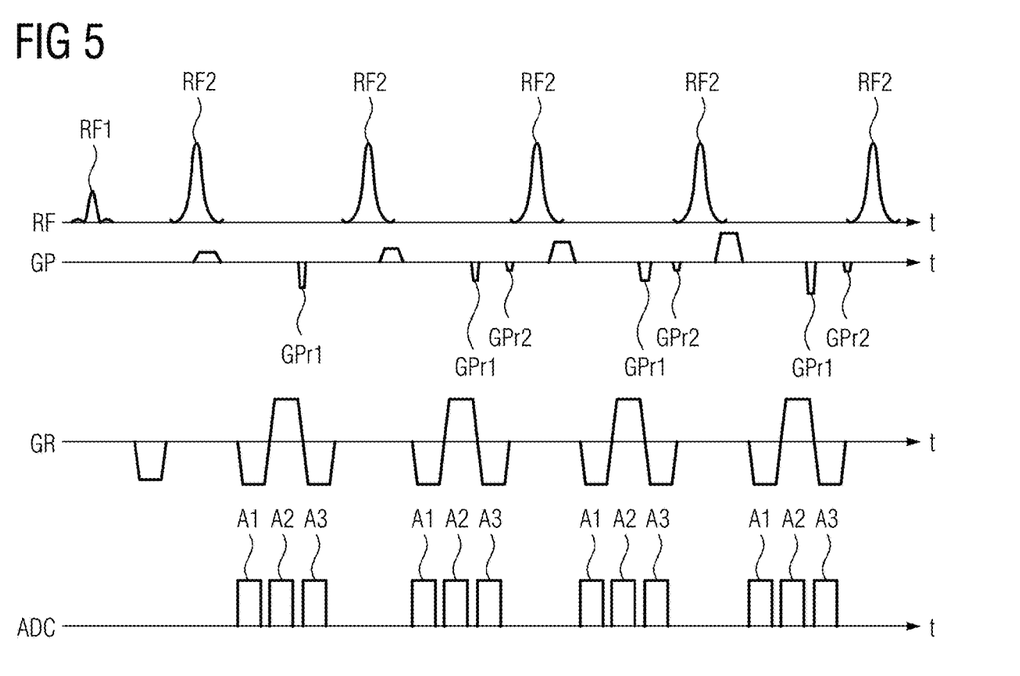

FIG. 5 shows a further example of a schematic sequence diagram such as can be used in accordance with aspects of the present disclosure. Unlike the examples shown in FIGS. 3 and 4, in FIG. 5 in third readout windows A3 third echo signals are each created after an RF refocusing pulse RF2 are read out. To do so, the gradients switched in the readout direction GR are modified accordingly to allow the acquisition of the further measurement data. In the example shown, after each RF refocusing pulse RF2 in corresponding readout windows A1, A2, A3, a gradient in the readout direction is switched in each case with the same polarity. It is however likewise conceivable for the gradients in the readout direction (similar to FIG. 4) to change their polarity after each RF refocusing pulse RF2. The readout window A3 here can also be chosen shorter than the readout window A1 and/or A2, whereby the spatial resolution of the navigator data ND in the readout direction would be reduced, which however should not have any great influence on the desired purposes of the navigator data (see below), but can shorten the measurement time for it.

The further measurement data acquired in the readout windows A3 can likewise be read out as navigator data ND and stored. For example, in order to acquire further measurement data as navigator data ND at specific k-space positions, e.g. at positions close to the center of the k-space, in the phase encoding direction GP before a third point in time and thus before a third readout window A3, dedicated turnback phase encoding gradients GPr1 can be switched, which act in such a way that further measurement data read out at a third point in time lies on k-space trajectories that are arranged in a desired area of the k-space close to its center, in particular in such a way that the further measurement data read out at a third point in time lies on a k-space trajectory running through the center of the k-space. Further turnback phase-encoding gradients GPr2 can also be switched after a readout window A3, for example to let a moment of excited spins in the phase encoding direction, possibly not yet completely turned around before a following RF pulse, e.g. an RF refocusing pulse RF2, disappear as completely as possible for the preceding readout window A3.

Figure 7:
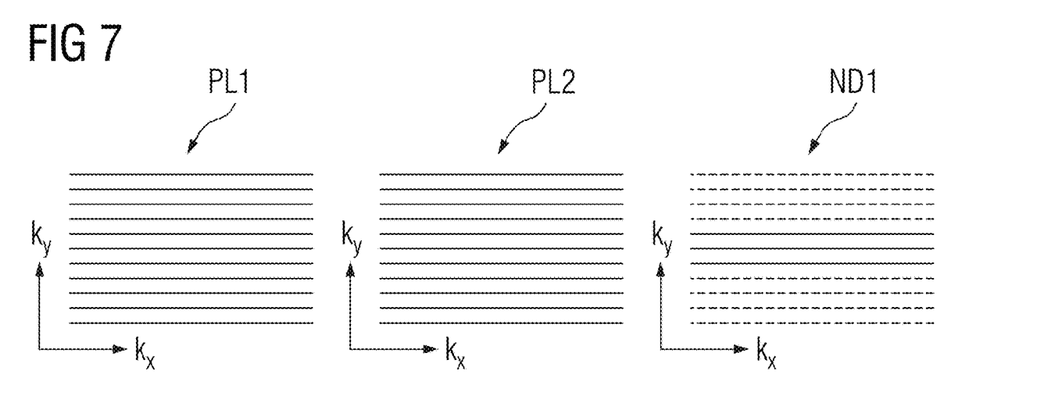
Figure 8:
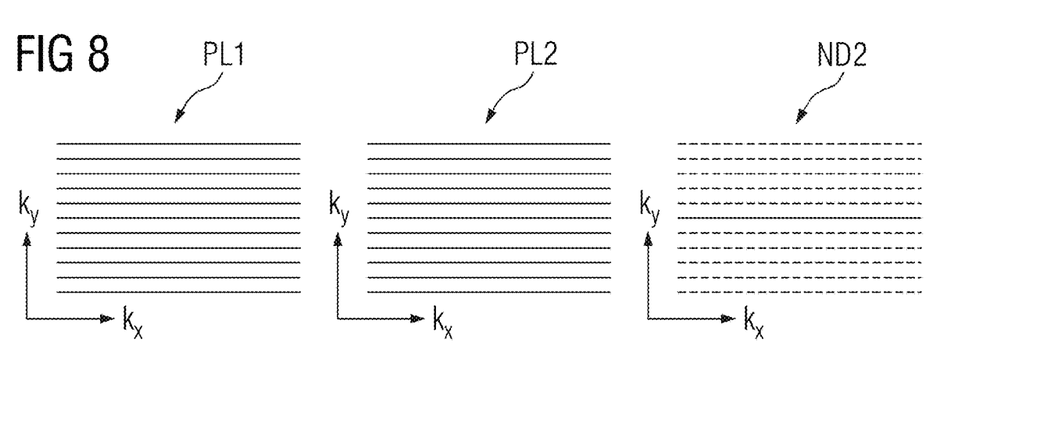

FIGS. 7 and 8 show further examples of how the k-space can be filled in the plane spanned by readout direction kx and phase encoding direction ky during the recording of measurement data at different points in time. For example, a k-space completely filled (here with k-space rows) for a first phase position PL1 and for a second phase position PL2 is shown in FIGS. 7 and 8 in each case. This can involve k-spaces PL1 and PL2 being completely filled with acquired measurement data or also k-spaces PL1 and PL2 filled with undersampled acquired measurement data and subsequently expanded, e.g. by means of ppa. As described above, for each readout direction separate k-spaces (not shown here) can be established for each phase position PL1 and PL2. Moreover, shown in FIGS. 7 and 8 on the right are examples of k-spaces ND1 and ND2 filled with navigator data.

The k-space ND1 shown in FIG. 7, by contrast with the k-spaces PL1 and PL2, is only filled with navigator data ND in an area of the k-space close to the center, here in a few k-space rows comprising the central k-space row (ky=0) and just a few k-space rows at a distance from said row. In order to achieve such sampling of the k-space ND1, the turnback phase encoding gradients GPr1 and GPr2 described in relation to FIG. 5 can be switched. The navigator data ND here can be acquired in each case by means of a number of readout windows A3 (e.g. thus in each case after a corresponding number of RF refocusing pulses RF2), which corresponds to the number of desired k-space rows for example, for which navigator data ND is to be acquired. For example, in a segmented recording of the measurement data intended for the two phase positions PL1 and PL2, navigator data ND, which fills a k-space ND1, can be acquired in each acquired segment.

Thus for example, from such navigator data ND of a k-space ND1, a low-resolution image of the examination object can be constructed in each case by Fourier transformation, through which a series of low-resolution images of the examination object can be obtained, on the basis of which a movement of the examination object, e.g. by using a registration method on the series of low-resolution images, with reference to which, on the basis of the navigator data ND, movement data can be established as correction data KD that describes movements of the examination object (block 705).

On the basis of such movement data KD, a movement correction of combination images KD1.1, KD2.2, KD1.2, KD2.1 can be carried out, so that movement-corrected combination images KD1.1', KD2.2', KD1.2', KD2.1' are obtained (block 707).

For example, on the basis of such established movement data KD (and/or on the basis of a physiological movement determined described below as correction data KD) a comparison with data that describes an allowed movement can be carried out and, if the result of the comparison is that a movement described by the movement data KD established lies outside a range of allowed movement (comparison 709, n), a renewed recording of measurement data 701, which was recorded during the movement established, is instigated.

If the result of the comparison of the established movement data KD with the data that describes an allowed movement is that the movement described by the established movement data KD lies within the allowed range (comparison 709, y) the processing of the possibly movement-corrected combination images KD1.1, KD2.2, KD1.2, KD2.1 or KD1.1', KD2.2', KD1.2', KD2.1' can be continued.

The k-space ND2 shown in FIG. 8 on the right, by contrast with the k-spaces PL1 and PL2, is only filled with navigator data ND in precisely the central k-space row. In order to achieve such a sampling of the k-space ND2, the turnback phase-encoding gradients GPr1 described in relation to FIG. 5 can each be switched in such a way that, even before the readout window A3, the moment of the gradients in the phase encoding direction disappears, further gradients in the phase encoding direction after a readout window A3 can be omitted here.

From such navigator data ND of a k-space ND2 (in addition or as an alternative to the navigator data ND of a k-space ND1 described in relation to FIG. 7) for example a physiological movement, e.g. a breathing movement, can be determined as correction data KD (block 705). On the basis of a specific physiological movement KD' there can be a gating of acquired measurement data (block 707) for example, through which combination images KD1.1', KD2.2', KD1.2', KD2.1' assigned to specific states of a physiological movement determined can be obtained.

For example, on the basis of such established physiological movement data KD, in addition or as an alternative, it can be determined whether for each desired state of the physiological movement a desired combination image KD1.1', KD2.2', KD1.2', KD2.1' obtained exists. If this is not the case (comparison 709, n), a renewed recording of measurement data 701 can be instigated. If there are already combination images KD1.1', KD2.2', KD1.2', KD2.1' available for all desired physiological states (comparison 709, y) the processing of the possibly movement-corrected combination images KD1.1, KD2.2, KD1.2, KD2.1 or KD1.1', KD2.2', KD1.2', KD2.1' can be continued.

In addition to or as an alternative to the navigator data ND of a k-space ND1 described in relation to FIG. 7 (likewise in addition or as an alternative to a physiological movement determined described above) phase correction data can be determined from such navigator data ND of a k-space ND2 for example as correction data KD (block 705). Such a determination of phase correction data from navigator data ND of a described k-space ND2 is basically known. For example, this can be done as described in the U.S. Pat. No. 6,160,397.

On the basis of phase correction data KD determined in this way there can be a phase correction e.g. of measurement data acquired at different echo times (block 707), through which phase-corrected combination images KD1.1', KD2.2', KD1.2', KD2.1' are obtained (block 707).

It is also conceivable to acquire navigator data ND of a k-space ND2, e.g. for a phase correction described above, in a first of a number of echo trains of an acquisition of first and second measurement data, and navigator data ND of a k-space ND1, from which low-resolution image data can be constructed, in echo trains following the first echo train.

Through such an acquisition of further measurement data at a third point in time as navigator data, an overall duration of the measurement of the first and second measurement data is not necessarily lengthened, in particular when the moment of the gradients in the readout direction is also to be reduced to zero, e.g. by dephasing gradients, before a new RF pulse is radiated. By means of navigator data acquired in this way, additional information can be obtained and/or corrections can be made to the combination images created from the first and second measurement data acquired.

Instead of a Cartesian sampling of the k-space previously described, navigator data ND can also be acquired along other, e.g. non-Cartesian, in particular along radial, k-space trajectories. For this, the gradients switched during the acquisition of the further measurement data may be adapted accordingly. For example, from navigator data acquired along radial k-space trajectories, a physiological movement and at the same time general movement data of the examination object could be determined. Furthermore, in addition or as an alternative, methods already known for processing of physiological movements, in particular a breathing movement, such as e.g. PACE (Prospective Acquisition Correction) navigators or breath-holding techniques can be applied to increase the stability of the results.

By acquiring further measurement data in this way, with no extension of the measurement time, on the basis of which further measurement data correction data can be established, in particular an intrinsic movement correction (since the navigator data is acquired contemporaneously with the first and second measurement data) and/or a phase correction without loss of time can be undertaken by the acquisition of the further measurement data. Moreover, it can be established whether it makes sense to acquire already acquired measurement data once again, because already acquired measurement data is influenced too greatly by a movement of the examination object for example. In this way, the overall image quality can be improved by the further measurement data acquired and/or further diagnostic data, in particular about a physiological movement of the examination object, can be obtained from the further measurement data acquired.

Again, the methods described herein of an acquisition of further measurement data as navigator data can be used in particular for TSE DIXON methods, but also for other suitable method such as VIBE DIXON methods or for other bipolar Dixon recording methods or also for bipolar field-mapping methods, for example decay rate (T1/T2/T2*)-mapping or field strength (B0/B1) mapping methods, etc.

On the basis of at least one first and one second combination image KD1.1' or KD1.2' and KD2.1' or KD2.2' or KD1.1 or KD1.2 and KD2.1 or KD2.2, if necessary corrected as described above, which have been sorted for example in accordance with the polarity of the gradients switched during the acquisition of the first and second measurement data in the readout direction (block 711) in such a way that in each case a combination image from first measurement data and a combination image from second measurement data each with the same associated polarity of the gradients in the readout direction, at least one image SP1, SP2, SP1.1, SP2.2, SP1.2, SP2.1 can be constructed, which only represents signals of one spin species from the group of the first and the second spin species (block 713.1 and/or block 713.2 and/or block 715).

Figure 10:
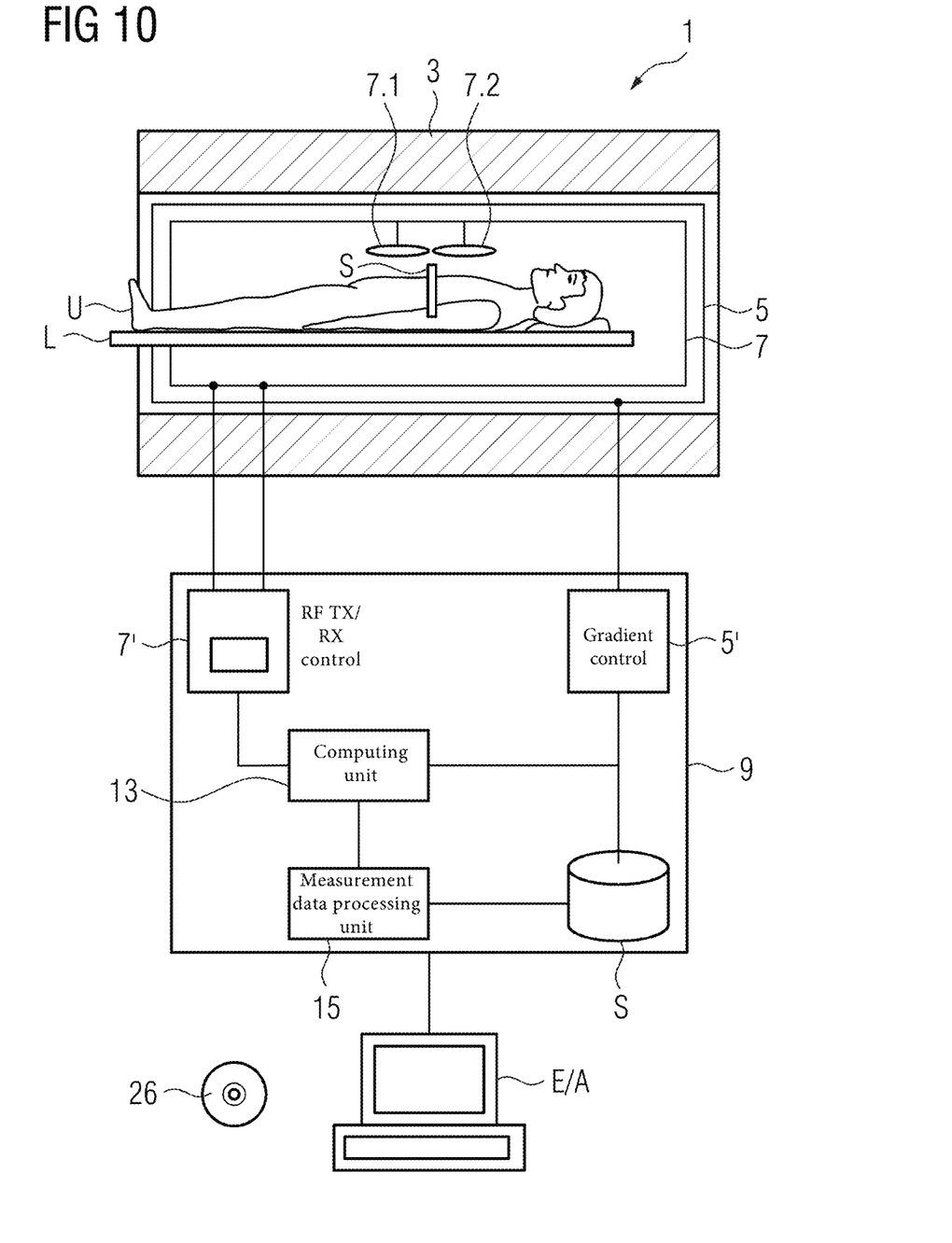
FIG. 10 shows a schematic representing an example magnetic resonance apparatus, in accordance with one or more aspects of the present disclosure.

FIG. 10 shows a schematic of an inventive magnetic resonance apparatus 1. This comprises a magnet unit 3 for creating the basic magnetic field, a gradient unit 5 for creating the gradient fields, a radio-frequency unit 7 for generating RF transmissions and for receiving radio-frequency signals and a control device 9 that is configured to perform the aspects as described herein.

In FIG. 10 these subunits of the magnetic resonance apparatus 1 are shown as rough schematics. In particular, the radio-frequency unit 7 can include a number of subunits, for example a number of coils such as the coils 7.1 and 7.2 shown schematically or more coils, which can either be embodied just for transmitting radio-frequency signals or just for receiving the triggered radio-frequency signals, or for both.

To examine an examination object U, for example a patient or a phantom, they can be introduced on a couch L into the magnetic resonance apparatus 1 in its measurement volume. The slice S represents an example of a target volume of the examination object, from which measurement data is to be recorded.

The control device 9 serves to control the magnetic resonance apparatus 1 and in particular can control the gradient unit 5 by means of a gradient control 5' and the radio-frequency unit 7 by means of a radio-frequency transmit/receive control 7'. The radio-frequency unit 7 here can comprise a number of channels, on which signals can be sent or received.

The radio-frequency unit 7 together with its radio-frequency transmit/receive control 7' is configured to generate and the transmission (radiation of) a radio-frequency alternating field for manipulation of the spins in a region of the examination object U to be manipulated (for example in slices S to be measured). In this case, the mid frequency of the radio-frequency alternating field, also referred to as the B1-field, is generally set where possible so that it lies close to the resonant frequency of the spins to be manipulated. Deviations of the mid frequency from the resonant frequency are referred to as off-resonance. To create the B1-field, controlled currents are applied to the RF coils in the radio-frequency unit 7 by means of the radio-frequency transmit/receive control 7'.

The control device 9 further contains a measurement data processing unit 15, with which the measurement datasets as discussed herein can be created from recorded measurement data and then processed in accordance with the aspects described herein. The control device 9 is thus configured to implement or otherwise perform the various aspects as described herein with respect to the various method aspects.

A computing unit 13 included in the control device 9 is configured to perform all computing operations needed for the necessary measurements and determinations. Intermediate results and results needed or established for this can be stored here in a memory unit S of the control device 9. The units shown are not absolutely to be understood here as physically separated units, but merely represent a subdivision into logical units, which can however also be realized for example in fewer units or also as one single physical unit.

Via an input/output device E/A of the magnetic resonance apparatus 1, control commands can be directed, by a user for example, to the magnetic resonance apparatus and/or results of the control device 9, such as e.g. image data, displayed.

A method described herein can also be present in the form of a computer program product, which comprises a program and implements the described method on a control device 9 or other suitable component when executed. Likewise, there can be an electronically-readable data medium 26 with electronically-readable control information stored thereon, which comprises at least one computer program product such as that just described and which is configured to carry out any of the methods described herein when the data medium 26 is used in a control device 9 of a magnetic resonance apparatus 1.

The various functional blocks, apparatuses, modules, units, components of physical or functional units, etc., as shown in the drawings and described herein may be implemented unless otherwise noted via any suitable number and type of computer processors, hardware components, the execution of software algorithms, or combinations thereof, and thus may alternatively be referred to as a "unit," "system," "circuitry," or "device."

What is claimed is:

1. A method for recording at least two measurement datasets of an examination object by means of magnetic resonance, comprising:
    transmitting at least one RF excitation pulse for exciting spins in the examination object;
    acquiring, while switching a readout gradient having a first polarity, first measurement data of an echo signal created at a first point in time after the transmitted at least one RF excitation pulse, for which spins of a first spin species present in the examination object have a first phase position relative to spins of a second spin species present in the examination object;
    acquiring, while switching a readout gradient having a second polarity that is different than the first polarity, second measurement data of an echo signal created at a second point in time after the transmitted at least one RF excitation pulse, for which spins of the first spin species present in the examination object have a second phase position different than the first phase position;
    generating a first combination image based on the acquired first measurement data;
    generating a second combination image based on the acquired second measurement data; and
    constructing at least one image that represents signals of one spin species from among the first and the second spin species on the basis of the first combination image and the second combination image.

2. The method as claimed in claim 1, wherein the act of acquiring the first measurement data and the second measurement data comprises acquiring at least one of the first measurement data and the second measurement data, respectively, at a point in time at which spins of the first spin species and spins of the second spin species are in-phase with one another.

3. The method as claimed in claim 1, wherein the act of acquiring the first measurement data and the second measurement data comprises acquiring at least one of the first measurement data and the second measurement data, respectively, at a point in time at which spins of the first spin species and spins of the second spin species have an opposed-phase with one another.

4. The method as claimed in claim 1, further comprising:
    transmitting at least one RF refocusing pulse after the transmission of the transmitted at least one RF excitation pulse.

5. The method as claimed in claim 1, further comprising:
    while switching the readout gradient having the second polarity, acquiring additional first measurement data of an echo signal created by the transmitted at least one RF excitation pulse at a point in time at which spins of the first spin species present in the examination object have the first phase position relative to spins of the second spin species present in the examination object, and
    while switching the readout gradient having the first polarity, acquiring additional second measurement data of an echo signal created by the transmitted at least one RF excitation pulse at a point in time at which spins of the first spin species present in the examination object have the second phase position relative to spins of the second spin species present in the examination object.

6. The method as claimed in claim 1, wherein the first measurement data and the second measurement data are each acquired, respectively, after the transmitted at least one RF excitation pulse, and further comprising:
acquiring additional first measurement data and additional second measurement data after the transmission of another RF excitation pulse.

7. The method as claimed in claim 1, further comprising:
acquiring the first measurement data, additional first measurement data, the second measurement data, and additional second measurement data after the transmitted at least one RF excitation pulse.

8. The method as claimed in claim 1, further comprising:
after the transmission of the transmitted at least one RF excitation pulse, transmitting a series of RF refocusing pulses; and
alternating acquiring of (i) first measurement data and second measurement data, and (ii) additional first measurement data and additional second measurement data, after each RF refocusing pulse within the series of transmitted RF refocusing pulses.

9. The method as claimed in claim 1, wherein at least one of the acquired first measurement data and the acquired second measurement data produces a set of measurement data that is undersampled according to a Nyquist condition such that only measurement data of every other k-space row is acquired, and further comprising:
expanding the set of measurement data using a parallel imaging technique to form a complete set of measurement data.

10. The method as claimed in claim 4, further comprising:
after transmission of the transmitted at least one RF excitation pulse or the transmitted at least one RF refocusing pulse, reading out and storing additional measurement data as navigator data.

11. The method as claimed in claim 10, further comprising:
calculating phase correction data on the basis of the navigator data, the phase correction data correcting for the phase of the first measurement data and the second measurement data that were acquired at different echo times.

12. The method as claimed in claim 10, further comprising:
calculating movement data on the basis of the navigator data, the movement data describing movements of the examination object.

13. The method as claimed in claim 12, further comprising:
performing a movement correction of the first combination image and the second combination image on the basis of the movement data.

14. The method as claimed in claim 12, further comprising:
determining a state of a physiological movement of the examination object on the basis of the movement data.

15. The method as claimed in claim 14, further comprising:
performing, using the state of the physiological movement of the examination object or the movement data, a comparison with data that describes an allowed movement of the examination object; and
when the comparison indicates that movement of the examination object exceeds the allowed movement, repeating the act of acquiring the first measurement data and the second measurement data.

16. A magnetic resonance apparatus, comprising:
a magnet;
gradient circuitry;
radio-frequency circuitry; and
a control device having a radio-frequency transmit/receive control circuitry and measurement data processing circuitry, the control device being configured to:
cause the RF circuitry to transmit at least one RF excitation pulse for exciting spins in an examination object;
acquire, while switching a readout gradient having a first polarity, first measurement data of an echo signal created at a first point in time after the transmitted at least one RF excitation pulse, for which spins of a first spin species present in the examination object have a first phase position relative to spins of a second spin species present in the examination object;
acquire, while switching a readout gradient having a second polarity that is different than the first polarity, second measurement data of an echo signal created at a second point in time after the transmitted at least one RF excitation pulse, for which spins of the first spin species present in the examination object have a second phase position different than the first phase position;
generate a first combination image based on the acquired first measurement data;
generate a second combination image based on the acquired second measurement data; and
construct at least one image that represents signals of one spin species from among the first and the second spin species on the basis of the first combination image and the second combination image.

17. A non-transitory computer-readable medium having instructions stored thereon that, when executed by control circuitry of a magnetic resonance apparatus, cause the magnetic resonance apparatus to:
cause RF circuitry to transmit at least one RF excitation pulse for exciting spins in an examination object;
acquire, while switching a readout gradient having a first polarity, first measurement data of an echo signal created at a first point in time after the transmitted at least one RF excitation pulse, for which spins of a first spin species present in the examination object have a first phase position relative to spins of a second spin species present in the examination object;
acquire, while switching a readout gradient having a second polarity that is different than the first polarity, second measurement data of an echo signal created at a second point in time after the transmitted at least one RF excitation pulse, for which spins of the first spin species present in the examination object have a second phase position different than the first phase position;
generate a first combination image based on the acquired first measurement data;
generate a second combination image based on the acquired second measurement data; and
construct at least one image that represents signals of one spin species from among the first and the second spin species on the basis of the first combination image and the second combination image.

* * * * *